United States Patent
Shin

(10) Patent No.: US 9,742,392 B2
(45) Date of Patent: Aug. 22, 2017

(54) SEMICONDUCTOR DEVICE PERFORMING BOOT-UP OPERATION

(71) Applicant: SK hynix Inc., Icheon-si, Gyeonggi-do (KR)

(72) Inventor: Tae Kyun Shin, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/041,554

(22) Filed: Feb. 11, 2016

(65) Prior Publication Data

US 2017/0085260 A1   Mar. 23, 2017

(30) Foreign Application Priority Data

Sep. 23, 2015 (KR) .................. 10-2015-0134997

(51) Int. Cl.
*H03L 7/00* (2006.01)
*H03K 17/22* (2006.01)
*G06F 1/24* (2006.01)

(52) U.S. Cl.
CPC ........... *H03K 17/22* (2013.01); *G06F 1/24* (2013.01); *G06F 2211/1097* (2013.01)

(58) Field of Classification Search
CPC ............................... H03K 17/22; H03K 3/037
USPC ................................................... 327/143
See application file for complete search history.

(56) References Cited

U.S. PATENT DOCUMENTS

| | | | | |
|---|---|---|---|---|
| 5,278,792 A | * | 1/1994 | Inoue | G11C 7/22 365/148 |
| 8,928,374 B2 | * | 1/2015 | Matsuno | H03L 5/02 327/143 |
| 2005/0083751 A1 | * | 4/2005 | Fujiu | H03K 17/223 365/222 |
| 2008/0225566 A1 | * | 9/2008 | Beattie | H03L 7/10 365/96 |
| 2015/0006926 A1 | * | 1/2015 | Hong | G06F 1/32 713/320 |
| 2015/0019853 A1 | * | 1/2015 | Hong | G06F 9/4401 713/2 |
| 2015/0241889 A1 | * | 8/2015 | Chen | G05F 1/67 327/143 |
| 2015/0377966 A1 | * | 12/2015 | Lee | G01R 31/31701 702/119 |

FOREIGN PATENT DOCUMENTS

KR   1020140124548 A   10/2014

* cited by examiner

*Primary Examiner* — Ryan Jager
(74) *Attorney, Agent, or Firm* — William Park & Associates Ltd.

(57) ABSTRACT

A semiconductor device includes a boot-up start signal generation unit configured to generate a boot-up start signal which is enabled in synchronization with a time at which a preset delay period has passed from a time point at which an initialization signal is enabled after a power-up period is ended, and a boot-up period signal generation unit configured to generate a boot-up period signal which is enabled according to a set pulse generated in synchronization with a time point at which the boot-up start signal is enabled.

9 Claims, 6 Drawing Sheets

SEMICONDUCTOR DEVICE PERFORMING BOOT-UP OPERATION

The present application claims priority under 35 U.S.C. §119(a) to Korean application number 10-2015-0134997, filed on Sep. 23, 2015, in the Korean Intellectual Property Office, which is incorporated herein by reference in its entirety.

BACKGROUND

1. Technical Field

Embodiments of the present disclosure relate to a semiconductor device which performs a boot-up operation.

2. Related Art

In general, a semiconductor device operates by receiving an exterior power supply voltage. A level of the power supply voltage supplied to the semiconductor device starts from a ground voltage level and rises up to a target voltage level with a constant slope. The power supply voltage is sometimes used to start various operations including a read operation, a write operation and the like during a period in which a level of the power supply voltage rises up to the target voltage level. When the semiconductor device receives the power supply voltage and starts the various operations however, an abnormal operation may occur with the power supply voltage level. Therefore, the semiconductor device starts operations after the power supply voltage rises up to the target voltage level.

The semiconductor device uses a fuse in order to store information (for example, various types of setting information, repair information and the like) required for various internal control operations. In a general fuse it is possible to program the fuse in a wafer state because data is distinguished according to whether the fuse has been cut by a laser. However, after the wafer is mounted in a package, it is not possible to program the fuse. In order to overcome such a disadvantage, an e-fuse is used. The e-fuse represents a fuse that stores data by changing resistance between a gate, and a drain or source of a transistor.

In order to recognize data of the e-fuse, a size of the transistor is increased, so that data may be directly recognized without a separate sensing operation. In other instances, instead of reducing the size of the transistor, a current flowing through the transistor is sensed using an amplifier, so that data of the e-fuse may be recognized. The two methods of recognizing data of an e-fuse have limitations in that an area of the transistor constituting the e-fuse is designed to be large and a data amplifier should be provided in each e-fuse.

Recently, in order to solve a limitation of an area of the e-fuse, a method for storing information required for an internal control operation of a semiconductor device using the e-fuse with an array has been researched.

SUMMARY

Various embodiments are directed to a semiconductor device capable of stably performing a boot-up operation.

In an embodiment, a semiconductor device includes: a boot-up start signal generation unit configured to generate a boot-up start signal which is enabled in synchronization with a time at which a preset delay period has ended from a time at which an initialization signal is enabled after a power-up period is ended; and a boot-up period signal generation unit configured to generate a boot-up period signal which is enabled according to a set pulse generated in synchronization with a time at which the boot-up start signal is enabled, wherein the boot-up period signal is disabled in response to an end pulse.

In an embodiment, a semiconductor device includes: a signal combination section configured to generate a combined power-up signal in response to a power-up signal enabled after a power-up period is ended and an initialization signal; a control signal generation section configured to generate an oscillator control signal in response to the combined power-up signal and to generate a boot-up start signal in response to a count output signal; and a counter output signal generation section configured to generate an oscillation signal in response to the oscillator control signal, and to generate a count output signal by performing a counting operation in synchronization with the oscillation signal.

In accordance with the present invention, a boot-up operation is started at the time at which a preset period has ended from the time at which an initialization signal has been enabled after a power-up period is ended, so that it is possible to stably perform the boot-up operation even though glitch occurs in the initialization signal.

DETAILED DESCRIPTION

Hereinafter, a semiconductor device will be described below with reference to the accompanying drawings through various examples of embodiments.

Figure 1:
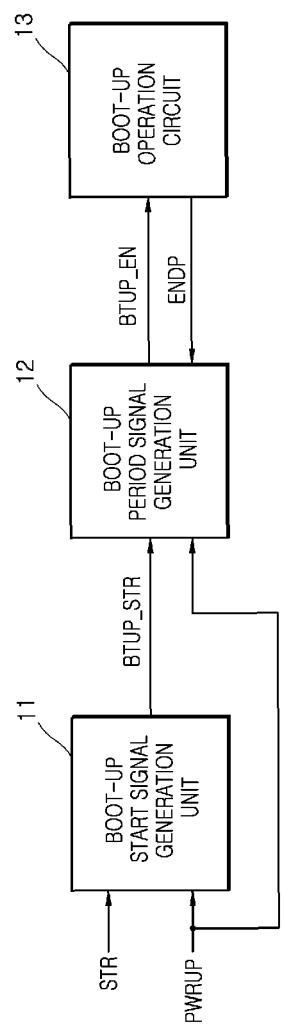
FIG. 1 is a block diagram illustrating a configuration of a semiconductor device in accordance with an embodiment.

As illustrated in FIG. 1, a semiconductor device in accordance with the present embodiment may include a boot-up start signal generation unit 11, a boot-up period signal generation unit 12, and a boot-up operation circuit 13.

The boot-up start signal generation unit 11 may generate a boot-up start signal BTUP_STR in response to an initialization signal STR and a power-up signal PWRUP. In more detail, the boot-up start signal generation unit 11 may generate the boot-up start signal BTUP_STR which is enabled in synchronization with a time at which a preset delay period has ended from the time point at which both the initialization signal STR and the power-up signal PWRUP have been enabled. The initialization signal STR may be an external signal inputted from an external device such as a controller, or the initialization signal STR may be an internal signal generated in the semiconductor device. A logic level and a time point which the initialization signal STR is enabled may be set in accordance with embodiments. The power-up signal PWRUP may be enabled when a logic level transitions when a period (hereinafter, referred to as a "power-up period") has ended, where the power-up period may include a time before a power supply voltage rises up to a target voltage level. A logic level at which the power-up signal PWRUP transitions at the end of the power-up period, may be set in accordance with embodiments. A logic level at which the boot-up start signal BTUP_STR is enabled may be set in accordance with embodiments. A more detailed configuration and operation of the boot-up start signal generation unit 11 will be described later with reference to FIG. 2.

The boot-up period signal generation unit 12 generates a boot-up period signal BTUP_EN in response to the boot-up start signal BTUP_STR, the power-up signal PWRUP, and an end pulse ENDP. The boot-up period signal BTUP_EN is reset when the power-up period has ended in response to the power-up signal PWRUP. The boot-up period signal BTUP_EN is enabled in response to the boot-up start signal BTUP_STR, and is disabled in response to the end pulse ENDP. A logic level at which the boot-up period signal BTUP_EN is enabled may be set in accordance with embodiments. The end pulse ENDP may include a pulse generated when a boot-up operation period is ended. More detailed configuration and operation of the boot-up period signal generation unit 12 will be described later with reference to FIG. 3.

The boot-up operation circuit 13 may perform a boot-up operation in response to the boot-up period signal BTUP_EN, and generate the end pulse ENDP. The boot-up operation circuit 13 may perform the boot-up operation during the boot-up operation period in which the boot-up period signal BTUP_EN is enabled. The boot-up operation circuit 13 may generate the end pulse ENDP including a pulse generated synchronously with the time at which the boot-up operation ends. More detailed configuration and operation of the boot-up operation circuit 13 will be described later with reference to FIG. 4.

Figure 2:
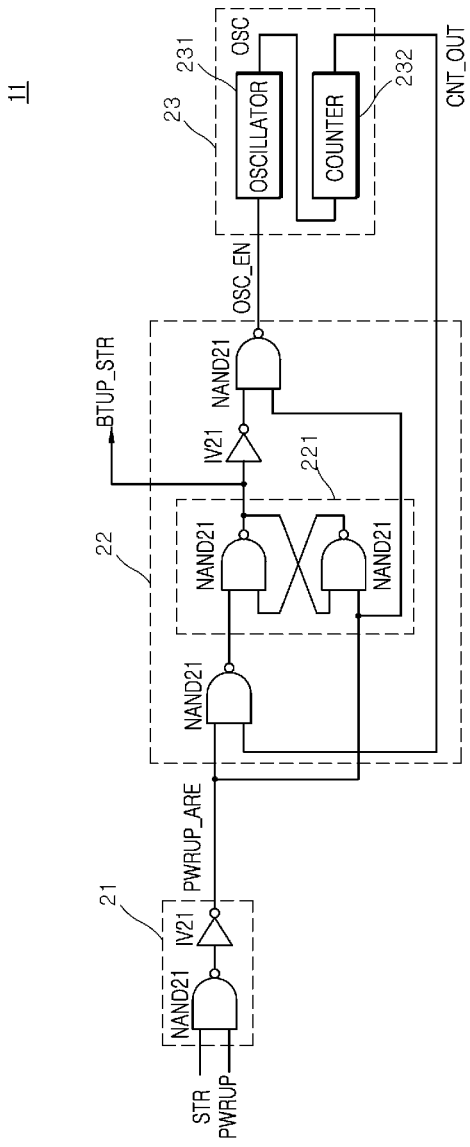
FIG. 2 is a diagram illustrating a configuration of a boot-up start signal generation unit included in a semiconductor device illustrated in FIG. 1 in accordance with an embodiment illustrated in FIG. 1.

Referring to FIG. 2, the boot-up start signal generation unit 11 may include a signal combination section 21, a control signal generation section 22, and a counter output signal generation section 23.

The signal combination section 21 may combine the initialization signal STR with the power-up signal PWRUP to generate a combined power-up signal PWRUP_ARE in response to the power-up signal PWRUP, which is enabled after the power-up period has ended, and the initialization signal STR. In more detail, when the power-up period has ended, the power-up signal PWRUP transitions from a logic low level to a logic high level and is enabled, and then the initialization signal STR is enabled to a logic high level. The signal combination section 21 may then generate the combined power-up signal PWRUP_ARE which is enabled to a logic high level when both the power-up signal PWRUP and the initialization signal STR are enabled. That is, the signal combination section 21 may generate the combined power-up signal PWRUP_ARE which is enabled when both the initialization signal STR and the power-up signal PWRUP are enabled.

The control signal generation section 22 may generate an oscillator control signal OSC_EN in response to the combined power-up signal PWRUP_ARE. In more detail, the control signal generation section 22 may generate the oscillator control signal OSC_EN which is enabled in synchronization with the time at which the combined power-up signal PWRUP_ARE is enabled. The control signal generation section 22 may generate the boot-up start signal BTUP_STR in response to a count output signal CNT_OUT. In more detail, the control signal generation section 22 may generate the boot-up start signal BTUP_STR which is enabled in synchronization with the time at which the count output signal CNT_OUT is enabled.

The counter output signal generation section 23 may include an oscillator 231 and a counter 232. The oscillator 231 may generate an oscillation signal OSC, which is a periodic signal, when the oscillator control signal OSC_EN is enabled. The counter 232 may perform a counting operation in synchronization with the oscillation signal OSC, and generate the count output signal CNT_OUT including a pulse which is generated when the preset delay period has ended. The counter 232 may detect the number times the oscillation signal OSC has toggled, and generate the count output signal CNT_OUT after the preset delay period has ended from the time at which the oscillation signal OSC has been enabled.

Figure 3:
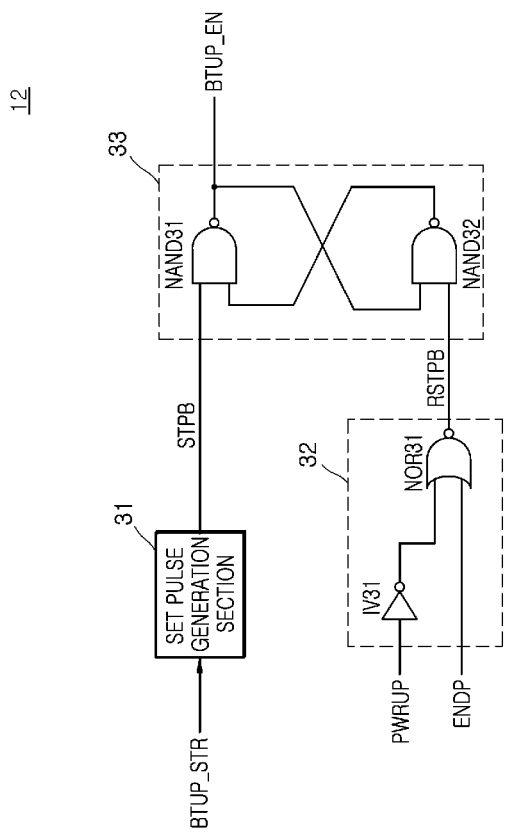
FIG. 3 is a diagram illustrating a configuration of a boot-up period signal generation unit included in a semiconductor device illustrated in FIG. 1 in accordance with an embodiment.

Referring to FIG. 3, the boot-up period signal generation unit 12 may include a set pulse generation section 31, a reset pulse generation section 32, and a latch section 33.

The set pulse generation section 31 may generate a set pulse STPB in response to the boot-up start signal BTUP_STR. The boot-up signal generation unit 12 may generate the boot-up period signal BTUP_EN which is enabled according to the set pulse STPB. The set pulse generation section 31 may generate the set pulse STPB including a pulse which is generated to a logic low level in synchronization with a time at which the boot-up start signal BTUP_STR is enabled.

The reset pulse generation section 32 may generate a reset pulse RSTPB in response to the power-up signal PWRUP and the end pulse ENDP. In more detail, the reset pulse generation section 32 may generate the reset pulse RSTPB at a logic low level in the power-up period. The reset pulse RSTPB may include a pulse which is generated to a logic low level by the power-up signal PWRUP. The reset pulse generation section 32 may generate the reset pulse RSTPB, including a pulse which is generated to a logic low level, in response to the end pulse ENDP. The end pulse ENDP may be generated to a logic low level after the power-up period has ended.

The latch section 33 may generate the boot-up period signal BTUP_EN in response to the set pulse STPB and the reset pulse RSTPB. In more detail, the latch section 33 may generate the boot-up period signal BTUP_EN, which is disabled to a logic low level, in a period in which the reset pulse RSTPB is at a logic low level. The latch section 33 may also generate the boot-up period signal BTUP_EN which is enabled to a logic high level in a period in which the set pulse STPB is at a logic low level.

Figure 4:
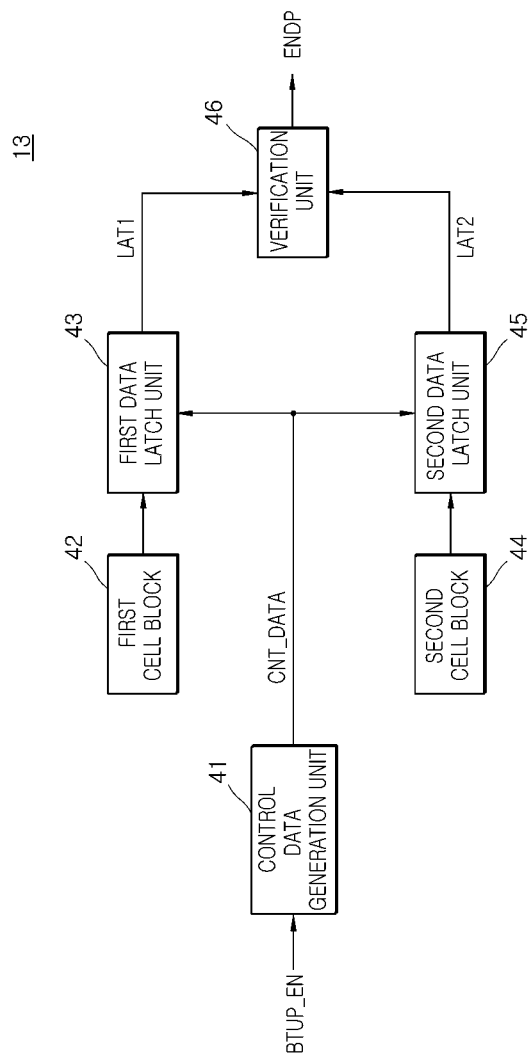
FIG. 4 is a block diagram illustrating a configuration of a boot-up operation circuit included in a semiconductor device illustrated in FIG. 1 in accordance with an embodiment.

Referring to FIG. 4, the boot-up operation circuit 13 may include a control data generation unit 41, a first cell block 42, a first data latch unit 43, a second cell block 44, a second data latch unit 45, and a verification unit 46.

The control data generation unit 41 performs a boot-up operation in a period in which the boot-up period signal BTUP_EN has been enabled. In the boot-up operation, control data CNT_DATA generated in the control data generation unit 41 in response to the boot-up period signal is transferred to the first data latch unit 43 and the second data latch unit 45. The control data CNT_DATA has been stored in an e-fuse array (not illustrated) included in the control data generation unit 41. The control data CNT_DATA includes information for an internal control operation on the first cell block 42 and information for an internal control operation on the second cell block 44. The information for the internal control operation represents repair information for repairing failed cells, setting information and the like. In the boot-up operation, the information for the internal control operation about the first cell block 42 is transferred via the control data CNT_DATA to and latched in the first data latch unit 43, and the information for the internal control operation about the second cell block 44 is transferred via the control data CNT_DATA to and latched in the second data latch unit 45.

The verification unit 46 generates the end pulse ENDP which is enabled when a first latch signal LAT1 and a second latch signal LAT2 are received and the boot-up operation is performed normally. That is, the verification unit 46 generates the end pulse ENDP which is enabled when the information for the internal control operation about the first cell block 42 is transferred via the control data CNT_DATA to and latched in the first data latch unit 43, and the information for the internal control operation about the second cell block 44 is transferred via the control data CNT_DATA to and latched in the second data latch unit 45.

Figure 5:
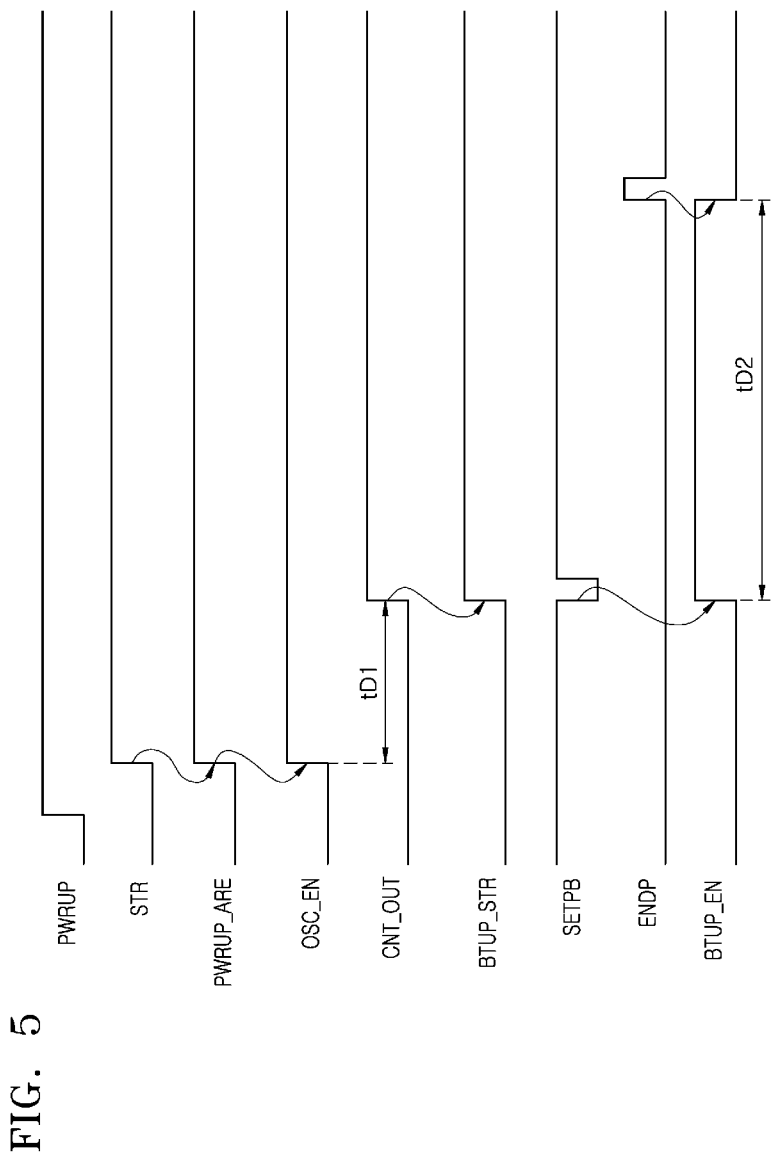
FIG. 5 is a timing diagram for explaining an operation of a semiconductor device illustrated in FIG. 1 to FIG. 4.

The operation of the semiconductor device configured as described above will be described below with reference to FIG. 5.

When the power-up period is ended, the power-up signal PWRUP is enabled to a logic high level, and the initialization signal STR is enabled to a logic high level, the combined power-up signal PWRUP_ARE is also enabled to a logic high level for generation.

The oscillator control signal OSC_EN is generated synchronously when the combined power-up signal PWRUP_ARE is enabled to the logic high level, and the count output signal CNT_OUT is enabled to a logic high level at the time when a preset first period tD1 has ended.

The boot-up start signal BTUP_STR is enabled to a logic high level in synchronization with the time at which the count output signal CNT_OUT is enabled to the logic high level. The set pulse STPB is generated, where the set pulse STPB includes a pulse generated to a logic low level in synchronization with the time at which the boot-up start signal BTUP_STR is enabled to the logic high level. The boot-up period signal BTUP_EN is enabled to a logic high level when a pulse of the set pulse STPB reaches a logic low level.

The boot-up operation is started from the time at which the boot-up period signal BTUP_EN is enabled to the logic high level, where the end pulse ENDP is generated. The end pulse END may include a pulse generated to a logic high level when the boot-up operation is ended at the time when a second period tD2 has passed. The boot-up period signal BTUP_EN is disabled to a logic low level in response to a pulse at a logic high level included in the end pulse ENDP.

As described above, the semiconductor device in accordance with the present embodiment generates the boot-up period signal BTUP_EN and starts the boot-up operation. The boot-up period signal BTUP_EN is enabled to a logic high level at the time at which the first period tD1 has ended. The first period tD1 begins from the time at which the initialization signal STR has been enabled after the power-up period is ended. Consequently, even though a glitch may occur in the initialization signal STR during a period from the time at which the initialization signal STR has been enabled to the time at which the first period tD1 has ended, the boot-up period signal BTUP_EN can still be stably enabled.

The semiconductor devices and/or system components (see FIGS. 1-5) are particularly useful in the design of memory devices, processors, and computer systems. For example, referring to FIG. 6, a block diagram of a system employing a semiconductor device and/or system component in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and/or a power driving circuit as discussed above with reference to FIGS. 1-5. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, at least one of the processor 1100, chipset 1150, memory devices 1350, memory controller 1200, disk driver controller 1300, internal disk driver 1450, and the like, may include the at least one system component as discussed above with relation to FIGS. 1-5. The memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 6 is merely one example of a system 1000 employing a semiconductor device and/or a system component as discussed above with relation to FIGS. 1-5. In alternate embodiments, such as, for example but not limited to, cellular phones or digital cameras, the components may differ from the embodiments illustrated in FIG. 6.

Figure 6:
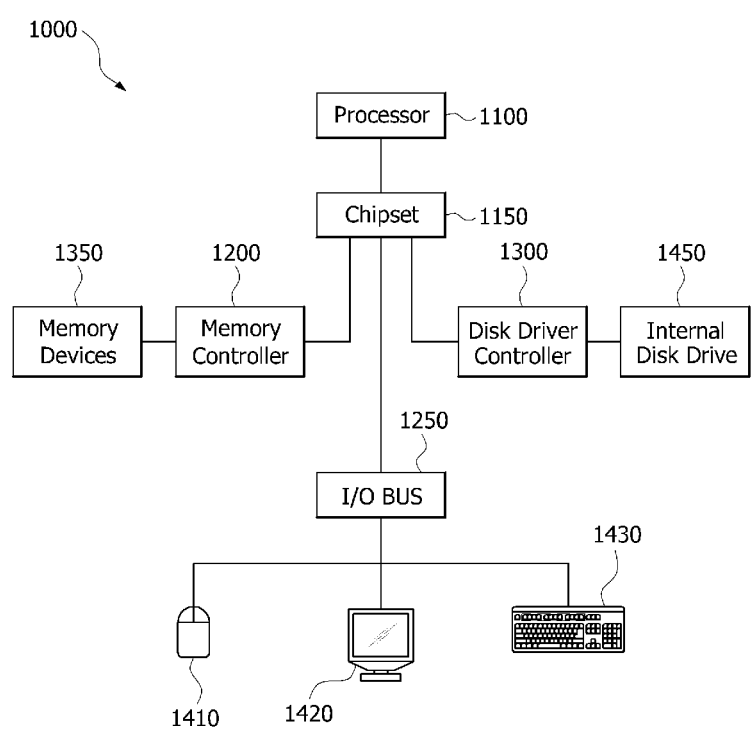
FIG. 6 illustrates a block diagram of an example of a representation of a system employing a semiconductor device in accordance with the various embodiments discussed above with relation to FIGS. 1-5.

FIG. 6 illustrates a block diagram of an example of a representation of a system employing semiconductor devices and/or system components in accordance with the various embodiments discussed above with relation to FIGS. 1-5

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
    a boot-up start signal generation unit configured to generate a boot-up start signal which is enabled in synchronization with a time point at which a preset delay period has passed from a time at which an initialization signal is enabled after a power-up period is ended;
    a boot-up period signal generation unit configured to generate a boot-up period signal which is enabled according to a set pulse generated in synchronization with a time at which the boot-up start signal is enabled, and
    a boot-up operation circuit configured to perform a boot-up operation in which control data generated in response to the boot-up period signal is transferred to a first data latch unit and a second data latch unit,
    wherein the boot-up period signal is disabled in response to an end pulse.

2. The semiconductor device of claim 1, wherein the boot-up start signal generation unit comprises:
    a signal combination section configured to generate a combined power-up signal in response to a power-up signal, enabled after the power-up period is ended, and the initialization signal.

3. The semiconductor device of claim 2, wherein the combined power-up signal is enabled when both the power-up signal and the initialization signal are enabled.

4. The semiconductor device of claim 1, wherein the boot-up start signal generation unit comprises:
    a control signal generation section configured to generate an oscillator control signal in response to the combined power-up signal and to generate the boot-up start signal in response to a count output signal.

5. The semiconductor device of claim 4, wherein the oscillator control signal is enabled in synchronization with a time at which the combined power-up signal is enabled, and the boot-up start signal is enabled in synchronization with a time at which the count output signal is enabled.

6. The semiconductor device of claim 1, wherein the boot-up start signal generation unit comprises:
    a counter output signal generation section configured to generate an oscillation signal in response to an oscillator control signal, and to generate a count output signal by performing a counting operation in synchronization with the oscillation signal.

7. The semiconductor device of claim 6, wherein the counter output signal generation section comprises:
    an oscillator configured to generate the oscillation signal when the oscillator control signal is enabled; and
    a counter configured to detect a toggling number of the oscillation signal and generate the count output signal which is enabled at a time at which the delay period has passed from a time at which the oscillator control signal has been enabled.

8. The semiconductor device of claim 1, wherein the boot-up period signal generation unit comprises:
    a set pulse generation section configured to generate a set pulse in response to the boot-up start signal;
    a reset pulse generation section configured to generate a reset pulse in response to the end pulse; and
    a latch section configured to generate the boot-up period signal in response to the set pulse and the reset pulse.

9. The semiconductor device of claim 1, wherein the boot-up operation circuit generates the end pulse when the boot-up operation is ended.

* * * * *